United States Patent
Ahn et al.

(10) Patent No.: US 8,084,808 B2
(45) Date of Patent: Dec. 27, 2011

(54) ZIRCONIUM SILICON OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 242 days.

(21) Appl. No.: 12/124,040

(22) Filed: May 20, 2008

(65) Prior Publication Data

US 2008/0217676 A1 Sep. 11, 2008

Related U.S. Application Data

(62) Division of application No. 11/117,121, filed on Apr. 28, 2005, now Pat. No. 7,390,756.

(51) Int. Cl.
*H01L 29/788* (2006.01)

(52) U.S. Cl. ..... 257/321; 257/324; 257/410; 257/E29.3; 438/216; 438/261

(58) Field of Classification Search ............... 257/321, 257/410, 324, E29.3, E29.309, E29.255; 438/216, 261
See application file for complete search history.

(56) References Cited

U.S. PATENT DOCUMENTS

| | | | |
|---|---|---|---|
| 4,645,622 A | 2/1987 | Kock | |
| 5,304,622 A | 4/1994 | Ikai et al. | |
| 6,020,024 A | 2/2000 | Maiti et al. | |
| 6,020,243 A | 2/2000 | Wallace et al. | |
| 6,060,755 A | 5/2000 | Ma et al. | |
| 6,075,691 A | 6/2000 | Duenas et al. | |
| 6,146,976 A | 11/2000 | Stecher et al. | |
| 6,174,809 B1 | 1/2001 | Kang et al. | |
| 6,200,893 B1 | 3/2001 | Sneh | |
| 6,203,613 B1 | 3/2001 | Gates et al. | |
| 6,225,163 B1 * | 5/2001 | Bergemont | 438/264 |
| 6,297,095 B1 | 10/2001 | Muralidhar et al. | |
| 6,297,103 B1 | 10/2001 | Ahn et al. | |
| 6,297,539 B1 | 10/2001 | Ma et al. | |
| 6,313,035 B1 | 11/2001 | Sandhu et al. | |
| 6,365,470 B1 | 4/2002 | Maeda | |
| 6,383,861 B1 | 5/2002 | Gonzalez et al. | |
| 6,392,257 B1 | 5/2002 | Ramdani et al. | |
| 6,395,650 B1 | 5/2002 | Callegari et al. | |
| 6,404,027 B1 | 6/2002 | Hong et al. | |
| 6,420,279 B1 | 7/2002 | Ono et al. | |

(Continued)

FOREIGN PATENT DOCUMENTS

EP 1096042 A1 5/2001

OTHER PUBLICATIONS

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998), 3 pgs.

(Continued)

*Primary Examiner* — Thinh T Nguyen
(74) *Attorney, Agent, or Firm* — Schwegman, Lundberg & Woessner, P.A.

(57) ABSTRACT

Electronic apparatus and systems include structures having a dielectric layer containing a zirconium silicon oxide film. A zirconium silicon oxide film may be disposed in an integrated circuit, as well as in a variety of other electronic devices. Additional apparatus, systems, and methods are disclosed.

25 Claims, 5 Drawing Sheets

U.S. PATENT DOCUMENTS

| | | | |
|---|---|---|---|
| 6,441,417 B1 | 8/2002 | Zhang et al. | |
| 6,441,421 B1* | 8/2002 | Clevenger et al. | 257/296 |
| 6,444,592 B1 | 9/2002 | Ballantine et al. | |
| 6,465,853 B1 | 10/2002 | Hobbs et al. | |
| 6,495,436 B2 | 12/2002 | Ahn et al. | |
| 6,504,214 B1 | 1/2003 | Yu et al. | |
| 6,509,280 B2 | 1/2003 | Choi | |
| 6,511,873 B2* | 1/2003 | Ballantine et al. | 438/239 |
| 6,514,828 B2 | 2/2003 | Ahn et al. | |
| 6,534,420 B2 | 3/2003 | Ahn et al. | |
| 6,541,079 B1 | 4/2003 | Bojarczuk, Jr. et al. | |
| 6,541,280 B2 | 4/2003 | Kaushik et al. | |
| 6,551,893 B1 | 4/2003 | Zheng et al. | |
| 6,551,929 B1 | 4/2003 | Kori et al. | |
| 6,559,014 B1 | 5/2003 | Jeon | |
| 6,563,160 B2* | 5/2003 | Clevenger et al. | 257/301 |
| 6,592,942 B1 | 7/2003 | Van Wijck | |
| 6,608,378 B2 | 8/2003 | Ahn et al. | |
| 6,617,639 B1 | 9/2003 | Wang et al. | |
| 6,632,279 B1 | 10/2003 | Ritala et al. | |
| 6,638,859 B2 | 10/2003 | Sneh et al. | |
| 6,642,573 B1 | 11/2003 | Halliyal et al. | |
| 6,645,882 B1* | 11/2003 | Halliyal et al. | 438/785 |
| 6,652,924 B2 | 11/2003 | Sherman | |
| 6,660,660 B2* | 12/2003 | Haukka et al. | 438/778 |
| 6,661,058 B2 | 12/2003 | Ahn et al. | |
| 6,673,701 B1 | 1/2004 | Marsh et al. | |
| 6,674,138 B1 | 1/2004 | Halliyal et al. | |
| 6,686,212 B1 | 2/2004 | Conley, Jr. et al. | |
| 6,699,747 B2 | 3/2004 | Ruff et al. | |
| 6,709,989 B2 | 3/2004 | Ramdani et al. | |
| 6,720,221 B1 | 4/2004 | Ahn et al. | |
| 6,730,163 B2 | 5/2004 | Vaartstra | |
| 6,730,164 B2 | 5/2004 | Vaartstra et al. | |
| 6,767,582 B1 | 7/2004 | Elers | |
| 6,767,795 B2 | 7/2004 | Ahn et al. | |
| 6,770,536 B2 | 8/2004 | Wilk et al. | |
| 6,770,923 B2 | 8/2004 | Nguyen et al. | |
| 6,774,050 B2 | 8/2004 | Ahn et al. | |
| 6,777,353 B2 | 8/2004 | Putkonen | |
| 6,780,704 B1* | 8/2004 | Raaijmakers et al. | 438/239 |
| 6,784,049 B2 | 8/2004 | Vaartstra | |
| 6,784,101 B1 | 8/2004 | Yu et al. | |
| 6,787,413 B2 | 9/2004 | Ahn | |
| 6,790,755 B2* | 9/2004 | Jeon | 438/591 |
| 6,794,284 B2 | 9/2004 | Vaartstra | |
| 6,794,315 B1 | 9/2004 | Klemperer et al. | |
| 6,794,709 B2 | 9/2004 | Ahn et al. | |
| 6,800,567 B2 | 10/2004 | Cho | |
| 6,803,311 B2 | 10/2004 | Choi | |
| 6,808,978 B2 | 10/2004 | Kim | |
| 6,812,100 B2 | 11/2004 | Ahn et al. | |
| 6,812,157 B1 | 11/2004 | Gadgil | |
| 6,821,862 B2 | 11/2004 | Cho | |
| 6,821,873 B2 | 11/2004 | Visokay et al. | |
| 6,831,315 B2 | 12/2004 | Raaijmakers et al. | |
| 6,833,308 B2 | 12/2004 | Ahn et al. | |
| 6,838,404 B2 | 1/2005 | Hentges et al. | |
| 6,844,203 B2 | 1/2005 | Ahn et al. | |
| 6,844,260 B2 | 1/2005 | Sarigiannis et al. | |
| 6,852,645 B2 | 2/2005 | Colombo et al. | |
| 6,858,865 B2 | 2/2005 | Ahn et al. | |
| 6,863,725 B2 | 3/2005 | Vaartstra et al. | |
| 6,884,719 B2 | 4/2005 | Chang et al. | |
| 6,884,739 B2 | 4/2005 | Ahn et al. | |
| 6,890,843 B2 | 5/2005 | Forbes et al. | |
| 6,900,481 B2 | 5/2005 | Jin et al. | |
| 6,921,702 B2 | 7/2005 | Ahn et al. | |
| 6,930,059 B2 | 8/2005 | Conley, Jr. et al. | |
| 6,958,300 B2 | 10/2005 | Vaartstra et al. | |
| 6,958,302 B2 | 10/2005 | Ahn et al. | |
| 6,960,538 B2 | 11/2005 | Ahn et al. | |
| 6,967,159 B2 | 11/2005 | Vaartstra | |
| 6,984,592 B2 | 1/2006 | Vaartstra | |
| 6,989,565 B1 | 1/2006 | Aronowitz et al. | |
| 6,989,573 B2 | 1/2006 | Ahn et al. | |
| 6,995,081 B2 | 2/2006 | Vaartstra | |
| 7,030,042 B2 | 4/2006 | Vaartstra et al. | |
| 7,037,574 B2 | 5/2006 | Paranjpe et al. | |
| 7,041,609 B2 | 5/2006 | Vaartstra | |
| 7,045,430 B2 | 5/2006 | Ahn et al. | |
| 7,049,192 B2 | 5/2006 | Ahn et al. | |
| 7,071,066 B2 | 7/2006 | Wang et al. | |
| 7,077,902 B2 | 7/2006 | Vaartstra | |
| 7,081,421 B2 | 7/2006 | Ahn et al. | |
| 7,084,078 B2 | 8/2006 | Ahn et al. | |
| 7,087,481 B2 | 8/2006 | Vaartstra et al. | |
| 7,101,813 B2 | 9/2006 | Ahn et al. | |
| 7,112,485 B2 | 9/2006 | Vaartstra | |
| 7,115,166 B2 | 10/2006 | Vaartstra et al. | |
| 7,115,528 B2 | 10/2006 | Vaartstra et al. | |
| 7,115,566 B2 | 10/2006 | Vaartstra et al. | |
| 7,122,415 B2 | 10/2006 | Jang et al. | |
| 7,122,464 B2 | 10/2006 | Vaartstra | |
| 7,125,815 B2 | 10/2006 | Vaartstra | |
| 7,129,553 B2 | 10/2006 | Ahn et al. | |
| 7,135,369 B2 | 11/2006 | Ahn et al. | |
| 7,135,421 B2 | 11/2006 | Ahn et al. | |
| 7,160,817 B2 | 1/2007 | Marsh | |
| 7,169,673 B2 | 1/2007 | Ahn et al. | |
| 7,183,186 B2 | 2/2007 | Ahn et al. | |
| 7,192,824 B2 | 3/2007 | Ahn et al. | |
| 7,192,892 B2 | 3/2007 | Ahn et al. | |
| 7,195,999 B2 | 3/2007 | Forbes et al. | |
| 7,196,007 B2 | 3/2007 | Vaartstra | |
| 7,199,023 B2 | 4/2007 | Ahn et al. | |
| 7,205,218 B2 | 4/2007 | Ahn et al. | |
| 7,211,492 B2 | 5/2007 | Forbes et al. | |
| 7,214,994 B2 | 5/2007 | Forbes et al. | |
| 7,235,501 B2 | 6/2007 | Ahn et al. | |
| 7,235,854 B2 | 6/2007 | Ahn et al. | |
| 7,250,367 B2 | 7/2007 | Vaartstra et al. | |
| 7,253,122 B2 | 8/2007 | Vaartstra | |
| 7,259,434 B2 | 8/2007 | Ahn et al. | |
| 7,271,077 B2 | 9/2007 | Vaartstra et al. | |
| 7,279,413 B2 | 10/2007 | Park et al. | |
| 7,294,556 B2 | 11/2007 | Vaartstra | |
| 7,300,870 B2 | 11/2007 | Vaartstra | |
| 7,309,664 B1 | 12/2007 | Marzolin et al. | |
| 7,312,494 B2 | 12/2007 | Ahn et al. | |
| 7,332,442 B2 | 2/2008 | Vaartstra et al. | |
| 7,368,402 B2 | 5/2008 | Vaartstra | |
| 7,374,617 B2 | 5/2008 | Vaartstra | |
| 7,410,918 B2 | 8/2008 | Vaartstra | |
| 7,432,548 B2 | 10/2008 | Forbes et al. | |
| 7,498,230 B2 | 3/2009 | Ahn et al. | |
| 7,517,783 B2 | 4/2009 | Ahn et al. | |
| 7,563,730 B2 | 7/2009 | Forbes et al. | |
| 7,582,549 B2 | 9/2009 | Ahn et al. | |
| 7,605,030 B2 | 10/2009 | Forbes et al. | |
| 7,717,910 B2 | 6/2010 | Ahn | |
| 7,759,747 B2 | 7/2010 | Forbes et al. | |
| 7,776,765 B2 | 8/2010 | Forbes et al. | |
| 7,927,996 B2 | 4/2011 | Ahn et al. | |
| 7,985,995 B2 | 7/2011 | Ahn et al. | |
| 2001/0002280 A1 | 5/2001 | Sneh | |
| 2001/0009695 A1 | 7/2001 | Saanila et al. | |
| 2001/0012698 A1 | 8/2001 | Hayashi et al. | |
| 2001/0030352 A1 | 10/2001 | Ruf et al. | |
| 2002/0004276 A1 | 1/2002 | Ahn et al. | |
| 2002/0004277 A1 | 1/2002 | Ahn et al. | |
| 2002/0013052 A1 | 1/2002 | Visokay | |
| 2002/0019116 A1 | 2/2002 | Sandhu et al. | |
| 2002/0068466 A1 | 6/2002 | Lee et al. | |
| 2002/0086507 A1 | 7/2002 | Park et al. | |
| 2002/0089023 A1 | 7/2002 | Yu et al. | |
| 2002/0094632 A1 | 7/2002 | Agarwal et al. | |
| 2002/0110991 A1 | 8/2002 | Li | |
| 2002/0111001 A1 | 8/2002 | Ahn | |
| 2002/0122885 A1 | 9/2002 | Ahn | |
| 2002/0146916 A1 | 10/2002 | Irino et al. | |
| 2002/0155688 A1 | 10/2002 | Ahn | |
| 2002/0155689 A1 | 10/2002 | Ahn | |
| 2002/0176989 A1 | 11/2002 | Knudsen et al. | |
| 2002/0192974 A1 | 12/2002 | Ahn et al. | |
| 2002/0192975 A1 | 12/2002 | Ahn | |
| 2002/0192979 A1 | 12/2002 | Ahn | |

| | | | | | |
|---|---|---|---|---|---|
| 2002/0197881 A1 | 12/2002 | Ramdani et al. | 2005/0009368 A1 | 1/2005 | Vaartstra |
| 2003/0003635 A1 | 1/2003 | Paranjpe et al. | 2005/0009370 A1 | 1/2005 | Ahn |
| 2003/0003702 A1 | 1/2003 | Ahn | 2005/0019978 A1 | 1/2005 | Vaartstra et al. |
| 2003/0003722 A1 | 1/2003 | Vaartstra | 2005/0020017 A1 | 1/2005 | Ahn et al. |
| 2003/0003730 A1 | 1/2003 | Li | 2005/0023594 A1 | 2/2005 | Ahn et al. |
| 2003/0017717 A1 | 1/2003 | Ahn | 2005/0023624 A1 | 2/2005 | Ahn et al. |
| 2003/0027360 A1 | 2/2003 | Hsu et al. | 2005/0023625 A1 | 2/2005 | Ahn et al. |
| 2003/0045060 A1 | 3/2003 | Ahn et al. | 2005/0023626 A1 | 2/2005 | Ahn et al. |
| 2003/0045078 A1 | 3/2003 | Ahn et al. | 2005/0023627 A1 | 2/2005 | Ahn et al. |
| 2003/0049942 A1 | 3/2003 | Haukka et al. | 2005/0028733 A1 | 2/2005 | Vaartstra |
| 2003/0064607 A1 | 4/2003 | Leu et al. | 2005/0029547 A1 | 2/2005 | Ahn et al. |
| 2003/0067046 A1 | 4/2003 | Iwasaki et al. | 2005/0029604 A1 | 2/2005 | Ahn et al. |
| 2003/0104666 A1 | 6/2003 | Bojarczuk, Jr. et al. | 2005/0029605 A1 | 2/2005 | Ahn et al. |
| 2003/0119246 A1 | 6/2003 | Ahn | 2005/0032292 A1 | 2/2005 | Ahn et al. |
| 2003/0119291 A1 | 6/2003 | Ahn et al. | 2005/0032342 A1 | 2/2005 | Forbes et al. |
| 2003/0130127 A1 | 7/2003 | Hentges et al. | 2005/0032360 A1 | 2/2005 | Vaartstra |
| 2003/0132491 A1 | 7/2003 | Ahn | 2005/0034662 A1 | 2/2005 | Ahn |
| 2003/0157764 A1 | 8/2003 | Ahn et al. | 2005/0037563 A1 | 2/2005 | Ahn |
| 2003/0176065 A1 | 9/2003 | Vaartstra | 2005/0051828 A1 | 3/2005 | Park et al. |
| 2003/0181060 A1 | 9/2003 | Asai et al. | 2005/0054165 A1 | 3/2005 | Ahn et al. |
| 2003/0185980 A1 | 10/2003 | Endo | 2005/0070126 A1 | 3/2005 | Senzaki |
| 2003/0200917 A1 | 10/2003 | Vaartstra | 2005/0077519 A1 | 4/2005 | Ahn et al. |
| 2003/0207032 A1 | 11/2003 | Ahn et al. | 2005/0124109 A1 | 6/2005 | Quevado-Lopez et al. |
| 2003/0207540 A1 | 11/2003 | Ahn et al. | 2005/0124171 A1 | 6/2005 | Vaartstra |
| 2003/0207593 A1 | 11/2003 | Derderian et al. | 2005/0124175 A1 | 6/2005 | Ahn et al. |
| 2003/0227033 A1 | 12/2003 | Ahn et al. | 2005/0136689 A9 | 6/2005 | Vaartstra |
| 2003/0228747 A1 | 12/2003 | Ahn et al. | 2005/0138262 A1 | 6/2005 | Forbes |
| 2003/0235961 A1 | 12/2003 | Metzner et al. | 2005/0145959 A1 | 7/2005 | Forbes |
| 2004/0007171 A1 | 1/2004 | Ritala et al. | 2005/0157549 A1 | 7/2005 | Mokhlesi et al. |
| 2004/0009679 A1 | 1/2004 | Yeo et al. | 2005/0160981 A1 | 7/2005 | Vaartstra et al. |
| 2004/0023461 A1 | 2/2004 | Ahn et al. | 2005/0164521 A1 | 7/2005 | Ahn et al. |
| 2004/0023516 A1 | 2/2004 | Londergan et al. | 2005/0221006 A1 | 10/2005 | Vaartstra |
| 2004/0028811 A1 | 2/2004 | Cho et al. | 2005/0227442 A1 | 10/2005 | Ahn et al. |
| 2004/0033661 A1 | 2/2004 | Yeo et al. | 2005/0260357 A1 | 11/2005 | Olsen et al. |
| 2004/0033681 A1 | 2/2004 | Ahn et al. | 2005/0280067 A1 | 12/2005 | Ahn et al. |
| 2004/0036129 A1 | 2/2004 | Forbes et al. | 2005/0287804 A1 | 12/2005 | Vaartstra |
| 2004/0038554 A1 | 2/2004 | Ahn | 2005/0287819 A1 | 12/2005 | Vaartstra et al. |
| 2004/0040494 A1 | 3/2004 | Vaartstra et al. | 2006/0000412 A1 | 1/2006 | Ahn et al. |
| 2004/0040501 A1 | 3/2004 | Vaartstra | 2006/0001151 A1 | 1/2006 | Ahn et al. |
| 2004/0043151 A1 | 3/2004 | Vaartstra | 2006/0003517 A1 | 1/2006 | Ahn et al. |
| 2004/0043541 A1 | 3/2004 | Ahn et al. | 2006/0019033 A1 | 1/2006 | Muthukrishnan et al. |
| 2004/0043569 A1 | 3/2004 | Ahn et al. | 2006/0024975 A1 | 2/2006 | Ahn et al. |
| 2004/0043600 A1 | 3/2004 | Vaartstra | 2006/0027882 A1 | 2/2006 | Mokhlesi |
| 2004/0043604 A1 | 3/2004 | Vaartstra | 2006/0028869 A1 | 2/2006 | Forbes et al. |
| 2004/0043625 A1 | 3/2004 | Vaartstra et al. | 2006/0043492 A1 | 3/2006 | Ahn et al. |
| 2004/0043630 A1 | 3/2004 | Vaartstra et al. | 2006/0043504 A1 | 3/2006 | Ahn et al. |
| 2004/0043632 A1 | 3/2004 | Vaartstra | 2006/0046383 A1 | 3/2006 | Chen et al. |
| 2004/0043633 A1 | 3/2004 | Vaartstra | 2006/0046505 A1 | 3/2006 | Ahn et al. |
| 2004/0043634 A1 | 3/2004 | Vaartstra | 2006/0046521 A1 | 3/2006 | Vaartstra et al. |
| 2004/0043635 A1 | 3/2004 | Vaartstra | 2006/0046522 A1 | 3/2006 | Ahn et al. |
| 2004/0043636 A1 | 3/2004 | Vaartstra et al. | 2006/0048711 A1* | 3/2006 | Vaartstra |
| 2004/0110348 A1 | 6/2004 | Ahn et al. | 2006/0054943 A1* | 3/2006 | Li et al. ........................ 257/266 |
| 2004/0110391 A1 | 6/2004 | Ahn et al. | 2006/0118853 A1 | 6/2006 | Takata et al. |
| 2004/0126954 A1 | 7/2004 | Vaartstra et al. | 2006/0125030 A1 | 6/2006 | Ahn et al. |
| 2004/0135186 A1 | 7/2004 | Yamamoto | 2006/0128168 A1 | 6/2006 | Ahn et al. |
| 2004/0140513 A1 | 7/2004 | Forbes et al. | 2006/0148180 A1 | 7/2006 | Ahn et al. |
| 2004/0144980 A1 | 7/2004 | Ahn et al. | 2006/0172485 A1 | 8/2006 | Vaartstra |
| 2004/0161899 A1 | 8/2004 | Luo et al. | 2006/0176645 A1 | 8/2006 | Ahn et al. |
| 2004/0164357 A1 | 8/2004 | Ahn et al. | 2006/0177975 A1 | 8/2006 | Ahn et al. |
| 2004/0164365 A1 | 8/2004 | Ahn et al. | 2006/0183272 A1 | 8/2006 | Ahn et al. |
| 2004/0168627 A1 | 9/2004 | Conley, Jr. et al. | 2006/0189154 A1 | 8/2006 | Ahn et al. |
| 2004/0171280 A1 | 9/2004 | Conley, Jr. et al. | 2006/0223337 A1 | 10/2006 | Ahn et al. |
| 2004/0175882 A1 | 9/2004 | Ahn et al. | 2006/0228868 A1 | 10/2006 | Ahn et al. |
| 2004/0183108 A1 | 9/2004 | Ahn | 2006/0231017 A1 | 10/2006 | Vaartstra |
| 2004/0185654 A1 | 9/2004 | Ahn | 2006/0237764 A1 | 10/2006 | Ahn et al. |
| 2004/0187968 A1 | 9/2004 | Vaartstra | 2006/0244082 A1 | 11/2006 | Ahn et al. |
| 2004/0196620 A1 | 10/2004 | Knudsen et al. | 2006/0244100 A1 | 11/2006 | Ahn et al. |
| 2004/0197946 A1 | 10/2004 | Vaartstra et al. | 2006/0245984 A1 | 11/2006 | Kulkarni et al. |
| 2004/0203254 A1 | 10/2004 | Conley, Jr. et al. | 2006/0246741 A1 | 11/2006 | Ahn et al. |
| 2004/0214399 A1 | 10/2004 | Ahn et al. | 2006/0252211 A1 | 11/2006 | Ahn et al. |
| 2004/0217410 A1 | 11/2004 | Meng et al. | 2006/0252244 A1 | 11/2006 | Vaartstra et al. |
| 2004/0217478 A1 | 11/2004 | Yamamoto et al. | 2006/0252279 A1 | 11/2006 | Vaartstra |
| 2004/0219746 A1 | 11/2004 | Vaartstra et al. | 2006/0255470 A1 | 11/2006 | Ahn et al. |
| 2004/0222476 A1 | 11/2004 | Ahn et al. | 2006/0258175 A1 | 11/2006 | Vaartstra et al. |
| 2004/0224527 A1 | 11/2004 | Sarigiannis et al. | 2006/0261389 A1 | 11/2006 | Vaartstra |
| 2004/0235313 A1 | 11/2004 | Frank et al. | 2006/0261397 A1 | 11/2006 | Ahn et al. |
| 2004/0262700 A1 | 12/2004 | Ahn et al. | 2006/0263972 A1 | 11/2006 | Ahn et al. |
| 2004/0264236 A1 | 12/2004 | Chae et al. | 2006/0264064 A1 | 11/2006 | Ahn et al. |
| 2004/0266217 A1 | 12/2004 | Kim et al. | 2006/0267113 A1 | 11/2006 | Tobin et al. |

| | | |
|---|---|---|
| 2006/0270147 A1 | 11/2006 | Ahn et al. |
| 2006/0281330 A1 | 12/2006 | Ahn et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0048926 A1 | 3/2007 | Ahn |
| 2007/0048953 A1 | 3/2007 | Gealy |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090440 A1 | 4/2007 | Ahn et al. |
| 2007/0090441 A1 | 4/2007 | Ahn et al. |
| 2007/0099366 A1 | 5/2007 | Ahn et al. |
| 2007/0101929 A1 | 5/2007 | Ahn et al. |
| 2007/0111544 A1 | 5/2007 | Ahn |
| 2007/0134931 A1 | 6/2007 | Ahn et al. |
| 2007/0134942 A1 | 6/2007 | Ahn et al. |
| 2007/0144438 A1 | 6/2007 | Vaartstra |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0057659 A1 | 3/2008 | Forbes |
| 2008/0057690 A1 | 3/2008 | Forbes et al. |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0220618 A1 | 9/2008 | Ahn et al. |
| 2009/0146200 A1 | 6/2009 | Ahn et al. |

OTHER PUBLICATIONS

Herman, Marian, "Atomic layer epitaxy—12 years later", *Vacuum*, 42(1-2), (1991), 61-66.

Hubbard, K. J., et al., "Thermodynamic stability of binary oxides in contact with silicon", *Journal of Materials Research*, 11(11), (Nov. 1996), 2757-2776.

Ishii, Hiroyuki, "Growth and electrical properties of atomic-layer deposited $ZrO_2$/Si-nitride stack gate dielectrics", *Journal of Applied Physics*, 95(2), (Jan. 15, 2004), 536-542.

Iwai, H., et al., "Advanced gate dielectric materials for sub-100 nm CMOS", *International Electron Devices Meeting, 2002. IEDM '02. Digest.*, (Dec. 8-11, 2002), 625-628.

Lee, C. H., "MOS Characteristics of Ultra Thin Rapid Thermal CVD $ZrO_2$ and Zr Silicate Gate Dielectrics", *Electron Devices Meeting, 2000. IEDM Technical Digest. International*, (2000), 27-30.

Leskela, M, "ALD precursor chemistry: Evolution and future challenges", *Journal de Physique IV (Proceedings)*, 9(8), (Sep. 1999), 837-852.

Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999), 149-152.

Maria, J. P., et al., "High temperature stability in lanthanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Nakajima, Anri, et al., "$NH_3$-annealed atomic-layer-deposited silicon nitride as a high-k gate dielectric with high reliability", *Applied Physics Letters*, 80(7), (Feb. 2002), 1252-1254.

Nalwa, H. S, "Handbook of Thin Film Materials", *Deposition and Processing of Thin Films*, vol. 1, San Diego : Academic Press, (2002), 114-119.

Nam, Won-Hee, et al., "Atomic Layer Deposition of $ZrO_2$ Thin Films Using Dichlorobix[bis-(trimethylsilyl)amido]zirconium and Water", *Chemical Vapor Deposition*, 10(4), (2004), 201-205.

Ouyang, Lizhi, et al., "Electronic structure and dielectric properties of dielectric gate material $(ZrO_2)x(SiO_2)_{1-x}$", *Journal of Applied Physics*, 95(12), (Jun. 15, 2004), 7918-7924.

Rignanese, G.-M., et al., "Dielectric Constants of Zr Silicates: A First-Principles Study", *Physical Review Letters*, Vo.. 89, No. 11, (Sep. 9, 2002), 117601-1 through 117601-4.

Ritala, M., "Atomic layer deposition of oxide thin films with metal alkoxides as oxygen sources", *Science*, 288(5464), (Apr. 14, 2000), 319-321.

Sneh, Ofer, "Thin film atomic layer deposition equipment for semiconductor processing", *Thin Solid Films*, 402(1-2), (2002), 248-261.

Suntola, T., "Atomic Layer Epitaxy", *Handbook of Crystal Growth, 3: Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Tewg, J.Y., "Electrical and Physical Characterization of Zirconium-Doped Tantalum Oxide Films", *Electrochemical Society Proceedings*, 2002-28, (2002), 75-81.

Wilk, G D, et al., "Hafnium and zirconium silicates for advanced gate dielectrics", *Journal of Applied Physics*, 87(1), (Jan. 2000), 484-492.

Wilk, G. D., et al., "Electrical Properties of hafnium silicate gate dielectrics deposited directly on silicon", *Applied Physics Letters*, 74(19), (May 10, 1999), 2854-2856.

Wilk, G. D, "High-K gate dielectrics: Current status and materials properties considerations", *Journal of Applied Physics*, 89(10), (2001), 5243-5275.

Wilk, G. D., et al., "Stable zirconium silicate gate dielectrics deposited directly on silicon", *Applied Physics Letters*, 76(1), (Jan. 3, 1000), 112-114.

Zhong, Huicai, et al., "Electrical Properties of Ru and $RuO_2$ Gate Electrodes for Si-PMOSFET with $ZrO_2$ and Zr-Silicate Dielectrics", *Journal of Electronic Materials*, 30(12), (Dec. 2001), 1493-1498.

Kim, Won-Kyu, et al., "Atomic layer deposition of zirconium silicate films using zirconium tetrachloride and tetra-n-butyl orthosilicate", J. Vac. Sci. Technol. A, vol. 20, No. 6, (Nov./Dec. 2002), 2096-2100.

Sneh, Ofer, "Thin film atomic layer deposition equipment for semiconductor processing", Thin Solid Films, 402, (2002), 248-261.

Watanabe, Heiji, "Ultrathin zirconium silicate gate dielectrics with compositional gradation formed by self-organized reactions", Applied Physics Letters, vol. 81, No. 22, (Nov. 25, 2002), 4221-4223.

Wilk, G. D., "High-K gate dielectrics: Current status and materials properties considerations", Journal of Applied Physics, 89(10), (May 2001), 5243-5275.

* cited by examiner

US 8,084,808 B2

ZIRCONIUM SILICON OXIDE FILMS

RELATED APPLICATION(S)

This application is a divisional of U.S. application Ser. No. 11/117,121 filed Apr. 28, 2005, now U.S. Pat. No. 7,390,756 which is incorporated by reference herein in its entirety.

TECHNICAL FIELD

This application relates generally to semiconductor devices and device fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based metal oxide semiconductor field effect transistor (MOSFET). This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

An embodiment for a method of forming an electronic device includes forming a dielectric layer containing a zirconium silicon oxide film in an integrated circuit. The zirconium silicon oxide film may be formed by atomic layer deposition. Embodiments include structures for capacitors, transistors, memory devices, and electronic systems with dielectric layers containing an atomic layer deposited zirconium silicon oxide film, and methods for forming such structures.

DETAILED DESCRIPTION

Figure 1:
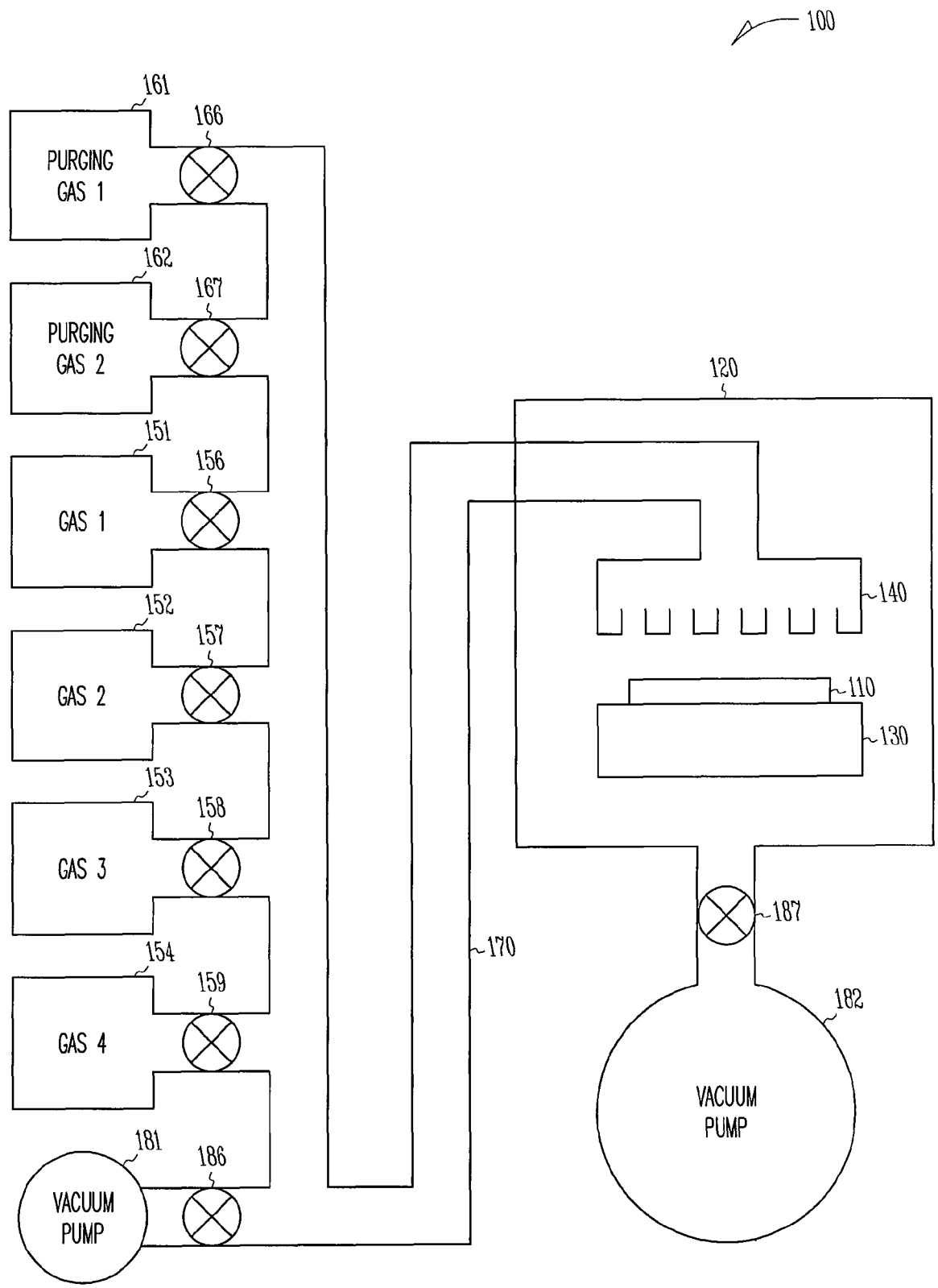
FIG. 1 depicts an atomic layer deposition system for an embodiment of a method for fabricating a dielectric layer containing a zirconium silicon oxide film.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined generally to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness may be eliminated by using a metal gate electrode. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages of using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those that can be fabricated as a thin layer with an amorphous form and that have high dielectric constants.

High-$\kappa$ materials include materials having a dielectric constant greater than silicon dioxide, for example, dielectric materials having a dielectric constant greater than about twice the dielectric constant of silicon dioxide. Examples of such high-$\kappa$ materials include $HfO_2$, $ZrO_2$, $Ta_2O_3$, $La_2O_3$, $Al_2O_3$, and $Y_2O_3$. Other materials that provide dielectric constants higher than silicon dioxide include metal silicates, though the dielectric constants of metal silicates tend to be lower than the corresponding metal oxides. One such silicate is zirconium silicate, $ZrSi_xO_y$ or $(ZrO_2)_x(SiO_2)_{1-x}$, which has a dielectric constant that depends on the zirconium concentration. For example, one zirconium silicate is zircon, $ZrSiO_4$, having a dielectric constant in the 12.5 range. In addition, since zirconium oxide tends to be thermally stable in contact with a silicon substrate, zirconium silicate may provide a good interface with the silicon substrate. With low zirconium content, a zirconium silicate has a lattice compatible with silicon dioxide. With increasing zirconium content, the zirconium silicate may have significant lattice changes relative to silicon dioxide. However, as the zirconium content in a zirconium silicate film increases, its dielectric constant also increases.

Dielectric layers of zirconium silicon oxide offer a material that can provide a relatively high dielectric constant with respect to silicon oxide. A zirconium silicon oxide film may include a zirconium silicate and/or a mixture of zirconium oxide and silicon oxide, written as $ZrO_x/SiO_y$. Engineering a zirconium silicon oxide film can provide dielectric layers for electronic devices with dielectric constants that may range in value from about 3.9 for $SiO_2$ to about 25 for $ZrO_2$.

Other characteristics for choosing a silicon oxide replacement include using materials that provide a sharp interface with silicon, which may provide a low density of interface states, a large energy barrier from the conduction band to the Fermi level of the gate electrode to maintain leakage current at acceptable levels, and structural stability with contact electrodes and substrate material during device processing steps performed after providing the dielectric layer.

Various embodiments for forming a zirconium silicon oxide film by atomic layer deposition provide a film having a zirconium silicate, a zirconium oxide/silicon oxide mixture, or a combination of a zirconium silicate and a zirconium oxide/silicon oxide mixture. Furthermore, the zirconium silicon oxide film may be a specific stoichiometric zirconium silicon oxide and/or a non-stoichiometric zirconium silicon oxide. The expression $ZrSi_xO_y$ is used herein to represent a stoichiometric and/or a non-stoichiometric zirconium silicate, the expression $ZrO_x$ is used herein to represent a stoichiometric and/or a non-stoichiometric zirconium oxide, and the expression $SiO_y$ is used herein to represent a stoichiometric and/or a non-stoichiometric silicon oxide. In various embodiments, both a silicon oxide and a zirconium oxide may be doped with other elements. Embodiments of dielectric layers containing an atomic layer deposited zirconium silicon oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Another consideration for selecting the material and method for forming a dielectric layer for use in electronic devices and systems concerns the roughness of a dielectric layer on a substrate. Surface roughness of the dielectric layer has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a zirconium silicon oxide dielectric layer having a substantially smooth surface relative to other processing techniques is formed using atomic layer deposition (ALD). Further, forming such a dielectric layer using atomic layer deposition may control transitions between material layers. Thus, atomic layer deposited zirconium silicon oxide dielectric layers can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas and/or evacuated, where in many cases the purging gas is an inert gas.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming zirconium oxide from a $ZrI_4$ precursor and $H_2O_2$, as its reactant precursor, forms an embodiment of a zirconium/oxygen sequence, which can also be referred to as a zirconium sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, $H_2O_2$ is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species. Additionally, deposition of a semiconductor material may be realized in a manner similar to forming a layer of a metal, given the appropriate precursors for the semiconductor material.

In an ALD formation of a compound having more than two elements, a cycle includes a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. There may be cases in which ALD formation of an $ABO_x$ compound uses one precursor that contains the elements A and B, such that pulsing the A/B containing precursor followed by its reactant precursor onto a substrate includes a reaction that deposits $ABO_x$ on the substrate to provide an A/B/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of zirconium silicon oxide is formed on a substrate mounted in a reaction chamber using ALD in repetitive zirconium and silicon sequences using precursor gases individually pulsed into the reaction chamber. Alternatively, solid or liquid precursors can be used in an appropriately designed reaction chamber.

FIG. 1 shows an embodiment of an atomic layer deposition system 100 for processing a dielectric layer containing a zirconium silicon oxide film. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154 whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases, fewer purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases from the gas conduit at the end of a purging sequence.

Vacuum pump, or exhaust pump, 182 is coupled by mass-flow controller 187 to remove excess precursor gases, purging gases, and by-product gases from reaction chamber 120 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other commercially available ALD systems can be used.

The use, construction and fundamental operation of reaction chambers for deposition of films are understood by those of ordinary skill in the art of semiconductor fabrication. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading and studying this disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

In an embodiment, a method for forming an electronic apparatus includes forming a dielectric layer containing a zirconium silicon oxide film in an integrated circuit. The zirconium silicon oxide film may be formed by atomic layer deposition. The zirconium silicon oxide film may be a $ZrO_x/SiO_y$ mixture film, a $ZrSi_xO_y$ film, or a film having a combination of a $ZrO_x/SiO_y$ mixture and $ZrSi_xO_y$. In an embodiment, the dielectric layer is formed substantially as the zirconium silicon oxide film. In an embodiment, the zirconium silicon oxide film is formed with a predetermined amount of silicon with respect to the total amount of silicon and zirconium in the zirconium silicon oxide film. In various non-limiting embodiments, the dielectric layer may be formed as a dielectric in a capacitor in an integrated circuit, as a dielectric in a capacitor of a dynamic random access memory, as a gate insulator in a silicon complementary metal oxide semiconductor (CMOS) transistor, as a tunnel gate insulator in a flash memory device, as an inter-gate insulator in a flash memory device, as a dielectric in a non-volatile read only memory (NROM) flash memory, and as a nanolaminate dielectric in a NROM flash memory. An embodiment of a dielectric layer containing a zirconium silicon oxide film may be formed as an integral part of a wide variety of electronic devices in electronic apparatus and systems.

Figures 2, 3:
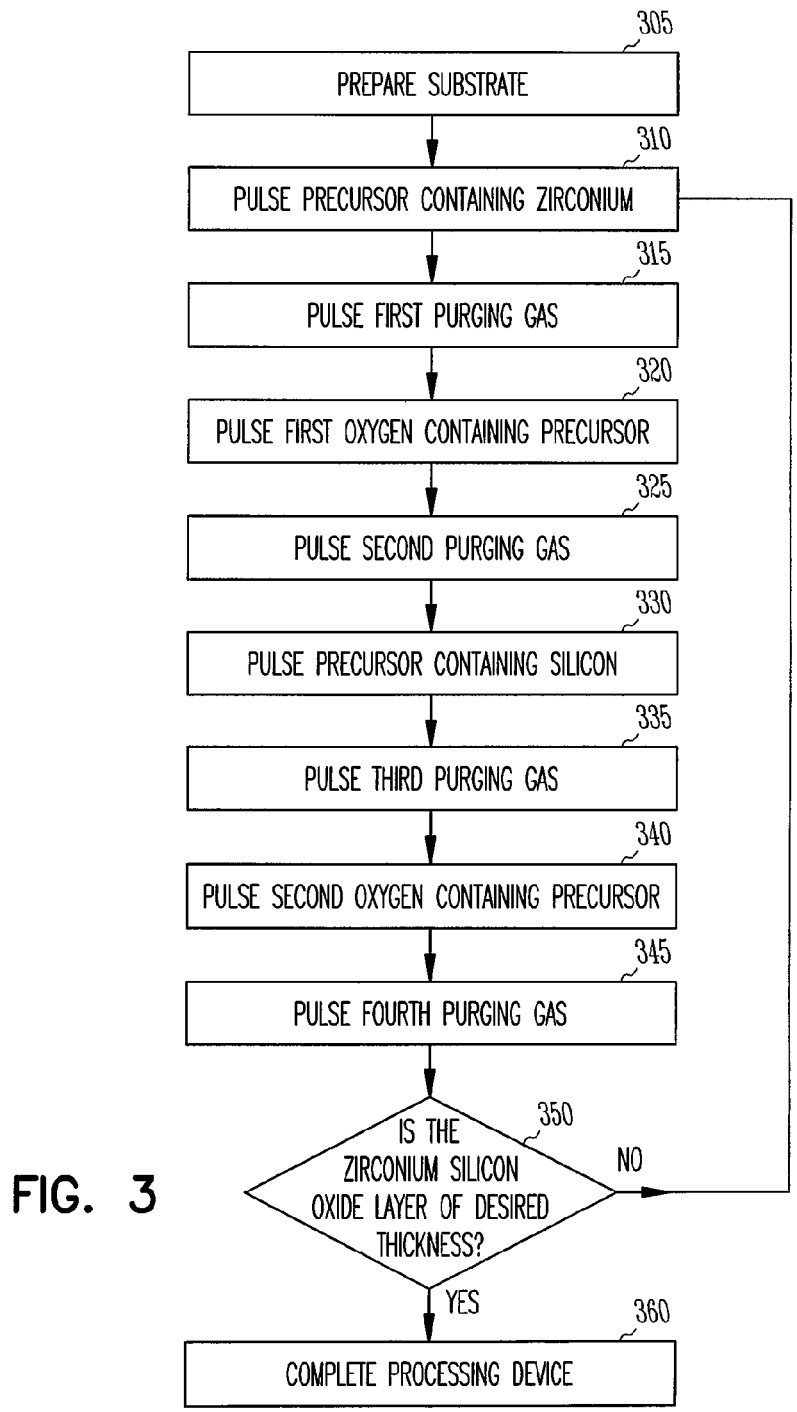
FIG. 2 illustrates a flow diagram of elements for an embodiment of a method to form a dielectric layer containing a zirconium silicon oxide film.
FIG. 3 illustrates a flow diagram of elements for an embodiment of a method to form a dielectric layer containing a zirconium silicon oxide film by atomic layer deposition.

FIG. 2 illustrates a flow diagram of elements for an embodiment of a method to form a dielectric layer containing a zirconium silicon oxide film. At 210, a zirconium precursor is pulsed to deposit zirconium, silicon, and oxygen on a substrate. In an embodiment, a layer of zirconium oxide is formed on a substrate by atomic layer deposition. The layer may be formed to provide uniform coverage of the desired area of the substrate surface for forming the dielectric layer. Alternatively, coverage of a specific device area may be attained with partial coverage during a particular processing of a sequence. A number of precursors containing zirconium may be used to deposit the zirconium, and a number of precursors containing oxygen may be used. In an embodiment, a dichlorobis[bis(trimethylsilyl)amido]zirconium precursor, $ZrCl_2[N(SiMe_3)_2]_2$, is used for a zirconium sequence. Me is an abbreviation referring to a methyl-group having the formula, $CH_3$. An oxidant reactant precursor to the $ZrCl_2[N(SiMe_3)_2]_2$ precursor may include, but is not limited to, one or more of water, atomic oxygen, molecular oxygen, ozone, or hydrogen peroxide.

A zirconium sequence using $ZrCl_2[N(SiMe_3)_2]_2$ and an oxidant precursor, such as $H_2O$, results in the deposition of an amount of silicon in a $ZrO_x$ layer. In an embodiment, the silicon may be distributed uniformly throughout the $ZrO_x$ layer. The amount of silicon deposited is dependent at least on the deposition temperature. As the deposition temperature increases, the amount of silicon increases. For example, in a deposition temperature range of about 150° C. to about 350° C., the amount of incorporated silicon may vary from approximately 1% to almost 5.5%. The application of the $ZrCl_2[N(SiMe_3)_2]_2$ precursor and $H_2O$ provides a zirconium silicon oxide film with a low silicon content (zirconium-rich). Other precursors for the zirconium sequence may include zirconium halides and oxygen precursors such as tetra-n-butyl orthosilicate (TBOS), water, atomic oxygen, molecular oxygen, ozone, or hydrogen peroxide.

At 220, a silicon precursor is pulsed to the substrate. Pulsing the silicon precursor may be used to control the silicon content in the zirconium silicon oxide film. In an embodiment, a layer of silicon oxide is formed on the substrate by atomic layer deposition. The silicon oxide and the zirconium oxide are deposited to form a zirconium silicon oxide film. In an embodiment, a silicon sequence is performed to control the silicon content in the zirconium silicon oxide film to adjust or compensate for silicon deposited in the zirconium sequence using a precursor such as $ZrCl_2[N(SiMe_3)_2]_2$. In an embodiment, zirconium oxide is deposited before silicon oxide. In an embodiment, silicon oxide is deposited before zirconium oxide. Alternatively, zirconium and silicon may be jointly deposited using precursors that substantially do not react with each other, but react at the substrate surface. The zirconium silicon oxide film may be formed as an integral component of an electronic device in an integrated circuit.

A zirconium silicon oxide layer may be formed using a number of cycles having various permutations of zirconium/oxide sequences and silicon/oxide sequences. In an embodiment, the zirconium sequences and the silicon sequences are controlled to form the zirconium silicon oxide film with a predetermined amount of silicon with respect to the total amount of silicon and zirconium in the zirconium silicon oxide film. By controlling the content of the silicon and the zirconium in the zirconium silicon oxide film, a film may be engineered with predetermined electrical characteristics. With a high silicon content relative to zirconium, the dielectric constant of the film approaches that of silicon oxide with a low leakage current density at a given electric field strength. With a low silicon content relative to zirconium, the dielectric constant of the film approaches that of zirconium oxide but with a higher leakage current density at the same electric field strength. The silicon content may be adjusted to provide a zirconium silicon oxide film having a dielectric constant in the 8-20 range, while maintaining an acceptable range of leakage current density.

Either before or after forming the zirconium silicon film, other dielectric layers such as nitride layers and/or insulating metal oxide layers may be formed as part of the dielectric layer or dielectric stack. Depending on the application, a dielectric stack may include a silicon oxide layer. The dielectric layer may be formed as a nanolaminate. An embodiment of a nanolaminate may include a layer of zirconium oxide and the zirconium silicon oxide film. Alternatively, the dielectric layer may be formed substantially as the zirconium silicon oxide film.

In various embodiments, the structure of the interface between the dielectric layer and the substrate on which it is disposed is controlled to limit the inclusion of silicon oxide, since a silicon oxide layer would reduce the effective dielectric constant of the dielectric layer. The material composition and properties for an interface layer are typically dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In the various embodiments, the thickness of a zirconium silicon oxide film is related to the number of ALD cycles performed and the growth rate associated with the selected permutations of sequences in the cycles. As can be understood by those skilled in the art, particular effective growth rates for the engineered zirconium silicon oxide film can be determined during normal initial testing of the ALD system for processing a zirconium silicon oxide dielectric for a given application without undue experimentation.

Atomic layer deposition of the individual components of the zirconium silicon oxide layer allows for individual control of each precursor pulsed into the reaction chamber. Thus, each precursor is pulsed into the reaction chamber for a predetermined period, where the predetermined period can be set separately for each precursor. In an embodiment, an ALD silicon sequence may be used to control the overall silicon content of the zirconium silicon oxide film to adjust for silicon deposited in a zirconium sequence. Additionally, for various embodiments for ALD formation of a zirconium silicon oxide layer, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a film of zirconium silicon oxide. Additionally, excess gases and byproducts may be removed from the reaction chamber by purging and/or evacuating the reaction chamber.

FIG. 3 illustrates a flow diagram of elements for an embodiment of a method to form a dielectric layer containing an atomic layer deposited zirconium silicon oxide layer. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process may include cleaning substrate 110 and forming layers and regions of the substrate, such as drains and sources of a metal oxide semiconductor (MOS) transistor, prior to forming a gate dielectric. Alternatively, these active regions may be formed after forming the dielectric layer, depending on the overall fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a zirconium silicon oxide dielectric formed using the atomic layer deposition process. The material composition and properties of an interface layer are typically dependent on process conditions and the condition of the substrate before forming the dielectric layer. Though the existence of an interface layer may effectively reduce the dielectric constant associated with the dielectric layer and its substrate, the interface layer, such as a $SiO_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Prior to forming a gate dielectric, masking of substrate regions to be protected during the gate dielectric formation, as is typically performed in MOS fabrication, may be included in the processing. In this exemplary embodiment, the unmasked region includes a body region of a transistor; however, one skilled in the art will recognize that other semiconductor device structures may utilize this process. Additionally, the substrate 110 in its ready-for-processing form is conveyed into a position in reaction chamber 120 for ALD processing.

At 310, a precursor containing zirconium, such as a $ZrCl_2[N(SiMe_3)_2]_2$ precursor, is pulsed into reaction chamber 120. The $ZrCl_2[N(SiMe_3)_2]_2$ may be pulsed into reaction chamber 120 through the gas-distribution fixture 140 onto substrate 110. The flow of the $ZrCl_2[N(SiMe_3)_2]_2$ may be controlled by mass-flow controller 156 from gas source 151, where the $ZrCl_2[N(SiMe_3)_2]_2$ is maintained. In an embodiment, the substrate temperature is maintained at temperature ranging from about 150° C. to about 500° C. by heating element 130. $ZrCl_2[N(SiMe_3)_2]_2$ may be thermally stable up to about 120° C. with partial decomposition above 150° C. during evaporation. The evaporation temperature of the $ZrCl_2[N(SiMe_3)_2]_2$ may be maintained at about 100° C. The $ZrCl_2[N(SiMe_3)_2]_2$ reacts with the surface of the substrate 110 in the desired region defined by the unmasked areas of the substrate 110. A precursor containing zirconium may include zirconium halides and/or zirconium alkylamide precursors.

At 315, a first purging gas is pulsed into the reaction chamber 120. In an embodiment, an inert gas is used as a purging gas and a carrier gas. The inert gas flow is controlled by mass-flow controller 166 from the purging gas source 161 into the gas conduit 170. Using the inert gas purge avoids overlap of the precursor pulses and possible gas phase reactions. In an embodiment, nitrogen, argon gas or other inert gases may be used as the purging gas. Following the purge, a first oxygen-containing precursor is pulsed into the reaction chamber 120, at 320.

For a zirconium sequence using $ZrCl_2-[N(SiMe_3)_2]_2$ as the precursor, vapor may be selected as the precursor acting as a reactant to deposit zirconium, silicon, and oxygen on the substrate 110. The $H_2O$ vapor is pulsed into the reaction chamber 120 through gas conduit 170 from gas source 152 by mass-flow controller 157. The water vapor aggressively reacts at the surface of substrate 110.

Following the pulsing of the first oxygen-containing precursor, a second purging gas is injected into the reaction chamber 120, at 325. An inert gas may be used to purge the reaction chamber after pulsing each precursor gas in the zirconium/oxygen sequence. In an embodiment, nitrogen, argon gas or other inert gases may be used as the purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

In an embodiment, the zirconium sequence may be performed a number of times before proceeding to pulse a precursor containing silicon into reaction chamber 120. Various growth rates for zirconium oxide may be attained, including a growth rate of about 1.1 Å/sequence cycle at about 250° C.

At 330, a precursor containing silicon is pulsed into reaction chamber 120. In an embodiment, $SiCl_4$ is used as the silicon-containing precursor. Other silicon halides, such as $SiI_4$, may be used. The $SiCl_4$ may be pulsed to the surface of the substrate 110 through gas-distribution fixture 140 from gas source 153 by mass-flow controller 158. In an embodiment, during pulsing of the $SiCl_4$, the substrate may be held between about 340° C. and about 375° C. by the heating element 130.

At 335, a third purging gas is introduced into the system. In an embodiment following a $SiCl_4$ precursor, an inert gas may be used as a purging and carrier gas. In various embodiments, nitrogen, argon, or other inert gases may be used as a purging gas. The flow of the third purging gas is controlled by mass-flow controller 167 from the purging gas source 162 into the gas conduit 170 and subsequently into the reaction chamber 120.

At 340, a second oxygen-containing precursor is pulsed into the reaction chamber 120. For a silicon sequence using $SiCl_4$ as the precursor, oxygen, in the form of $O_2$ or $O_3$, may be used as the precursor acting as an oxidizing reactant to interact at the substrate 110. The oxygen is pulsed into the reaction chamber 120 through gas conduit 170 from gas source 154 by mass-flow controller 159. The oxygen reacts aggressively at the surface of substrate 110. In an embodiment, during the oxygen pulsing, substrate 110 may be raised to a temperature significantly higher than the temperature used during the pulsing of the precursor containing silicon. In an embodiment, the temperature for substrate 110 is at about 550° C. during the oxygen pulsing.

At 345, a fourth purging gas is injected into the reaction chamber 120. In an embodiment, an inert gas is used as the fourth purging gas to purge the reaction chamber. In various embodiments, nitrogen, argon, or other inert gases may be used as the fourth purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

At 350, it is determined whether the zirconium silicon oxide film is of the desired thickness, t. The thickness of a zirconium silicon oxide film after one cycle is determined by the pulsing periods used in the zirconium sequences and the silicon sequences at the given temperatures. Typically, at a given temperature, the pulsing periods can vary over a significant range above some minimum pulse time for the precursors, without substantially altering the growth rate. Once a set of periods for one cycle is determined, the growth rate for the zirconium silicon oxide film will be set at a value such as N nm/cycle. For a desired zirconium silicon oxide film thickness in an application such as forming a gate dielectric of a MOS transistor, the ALD process should be repeated for t/N cycles.

The desired thickness should be completed after t/N cycles. If less than t/N cycles have been completed, the process starts over at 310 with the pulsing of the precursor containing zirconium. If t/N cycles have completed, no further ALD processing is required and the zirconium silicon oxide film is completed. Once the total number of cycles to form the desired thickness has been completed, the dielectric film containing the zirconium silicon oxide layer may optionally be annealed. In an embodiment, the zirconium silicon oxide layer is annealed in a dry oxygen atmosphere. Alternatively, the zirconium silicon oxide layer is annealed in a nitrogen atmosphere.

At 360, after forming the zirconium silicon oxide layer, processing the device having the dielectric layer containing zirconium silicon oxide layer is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternatively, completing the process includes completing the construction of a memory device having an array with access transistors formed with gate dielectrics containing atomic layer deposited zirconium silicon oxide layers. In an embodiment, completing the process includes the formation of an electronic system such as an information handling device that uses electronic devices with transistors formed with dielectric films containing an atomic layer deposited zirconium silicon oxide layer.

Embodiments for methods having elements similar to the embodiment of FIG. 3 may include numerous permutations for forming the zirconium silicon oxide layer. In an embodiment, the silicon sequence is conducted before the zirconium sequence. In an embodiment, a zirconium/silicon cycle may include a number, x, of zirconium sequences and a number, y, of silicon sequences. The number of sequences x, y may be selected to engineer the relative amounts of silicon to zirconium. In an embodiment, the number of sequences x and y, along with associated pulsing periods and times, is selected to form a zirconium silicon oxide with substantially equal amounts of zirconium and silicon. In an embodiment, the number of sequences is selected with x=y. In an embodiment, the number of sequences x and y are selected to form a zirconium-rich zirconium silicon oxide. Alternatively, the number of sequences x and y are selected to form a silicon-rich zirconium silicon oxide. In an embodiment of a method that includes forming a zirconium silicon oxide film, an atomic layer deposition sequence includes forming an atomic layer of zirconium oxide followed by forming an atomic layer of silicon oxide.

Various embodiments provide an atomic layer deposited zirconium silicon oxide film that are amorphous and have smooth interfaces with other layers relative to a zirconium silicon oxide film formed by other methods such as chemical vapor deposition, sputtering, sol gel, pulsed-laser deposition and reactive magnetron radio frequency sputtering. Processing a zirconium silicon oxide film by atomic layer deposition allows for the fabrication of an amorphous dielectric layer, which may avoid increased leakage current through grain boundaries that typically may accompany formation of polycrystalline films. Various embodiments provide a process for growing a dielectric film having a wide range of useful equivalent oxide thickness, $t_{eq}$ associated with a dielectric constant in the range from about 3.9 to about 25. Forming dielectric layers with dielectric constants at the higher range may allow the formation of layers with a $t_{eq}$ ranging from about 5 Å to about 20 Å. In an embodiment, a dielectric layer containing a zirconium silicon oxide layer may have a $t_{eq}$ of less than 5 Å. For applications relating to lower leakage current densities, zirconium silicon oxide films may be formed with lower dielectric constants. Zirconium silicon oxide films with dielectric constants around 12 may provide dielectrics with relatively low leakage current densities. Lower leakage current densities may be attained with zirconium silicon oxide films having dielectric constants less than 10. The dielectric constant and leakage current density characteristics of a dielectric layer containing a zirconium silicon oxide film may be controlled by selectively controlling the silicon content in the zirconium silicon oxide film. Additionally, the novel process can be implemented to form transistors, capacitors, memory devices, and other electronic systems including information handling devices.

Figure 4:
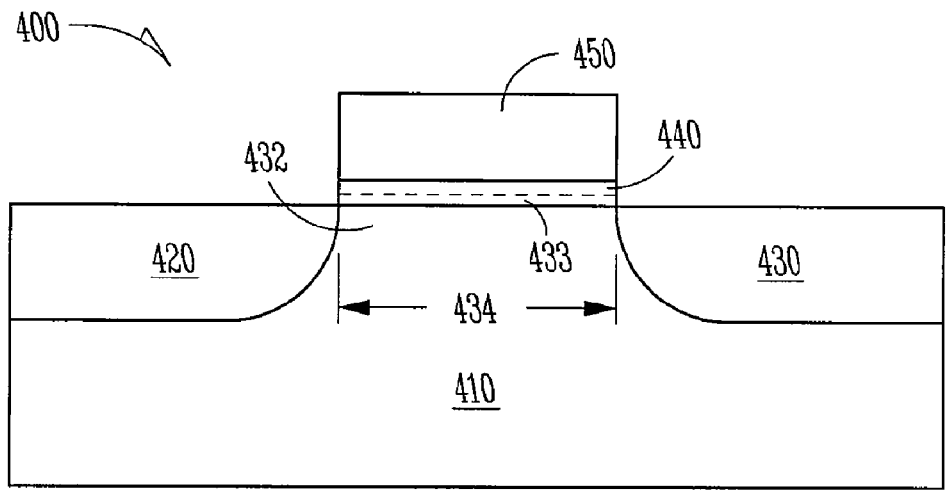
FIG. 4 shows an embodiment of a configuration of a transistor having a dielectric layer containing an atomic layer deposited zirconium silicon oxide film.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A gate 450 is formed over and contacts gate dielectric 440 disposed on substrate 410. In an embodiment, gate dielectric 440 contains a zirconium silicon oxide film. Gate dielectric 440 may be realized as a dielectric layer formed substantially of a zirconium silicon oxide film. Gate dielectric 440 may be a dielectric layer containing one or more layers of dielectric material in which at least one layer is a zirconium silicon oxide film. The zirconium silicon oxide film may be a zirconium silicon oxide film structured as monolayers of zirconium silicon oxide formed according to the teaching herein.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. In an embodiment, interfacial layer 433 is substantially without a silicon oxide layer. Forming the substrate, gate, and the source and drain regions may be performed using standard processes known to those skilled in the art. Additionally, the sequencing of the various elements of the process for forming a transistor may be conducted with standard fabrication processes, as known to those skilled in the art. In an embodiment, gate dielectric 440 may be realized as a gate insulator in a silicon CMOS transistor. Use of such a gate dielectric including a zirconium silicon oxide is not limited to silicon based substrates, but may be used with a variety of semiconductor substrates.

Figure 5:
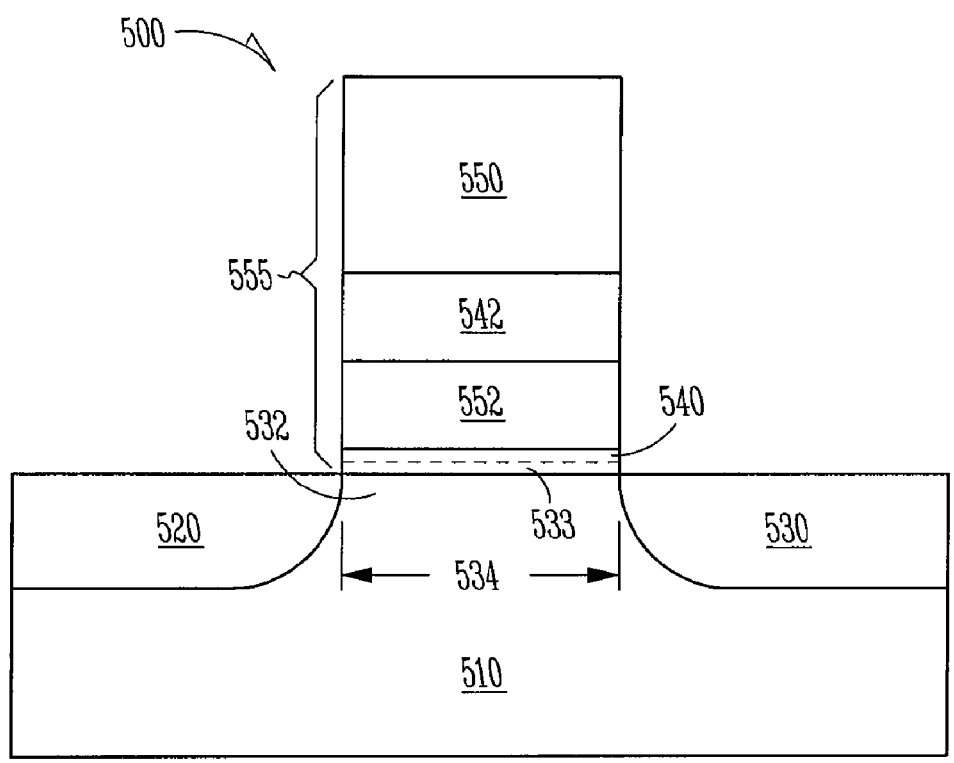
FIG. 5 shows an embodiment of a configuration of a floating gate transistor having a dielectric layer containing an atomic layer deposited zirconium silicon oxide film.

FIG. 5 shows an embodiment of a configuration of a floating gate transistor 500 having an insulating layer containing a zirconium silicon oxide film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. In an embodiment, floating gate 552 is formed over and contacts gate dielectric 540. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated. In an embodiment, interfacial layer 533 is substantially without a silicon oxide layer.

In an embodiment, gate dielectric 540 includes a dielectric containing an atomic layer deposited zirconium silicon oxide film. Gate dielectric 540 may be realized as a dielectric layer formed substantially of zirconium silicon oxide. Gate dielectric 540 may include multiple layers in which at least one layer is substantially zirconium silicon oxide. In an embodiment, gate dielectric 540 may include multiple layers where a substantially zirconium silicon oxide film contacts body region 532.

In an embodiment, floating gate dielectric 542 includes a dielectric layer having an atomic layer deposited zirconium silicon oxide film formed in embodiments similar to those described herein. Floating gate dielectric 542 may be realized as a dielectric layer formed substantially of zirconium silicon oxide. Floating gate dielectric 542 may include multiple layers in which at least one layer is substantially zirconium silicon oxide. In an embodiment, control gate 550 is formed over and contacts floating gate dielectric 542.

Alternatively, both gate dielectric 540 and floating gate dielectric 542 may be formed as dielectric layers including a zirconium silicon oxide film. Gate dielectric 540, and floating gate dielectric 542 may be realized by embodiments similar to those described herein, with the remaining elements of the transistor 500 formed using processes known to those skilled in the art.

In an embodiment, gate dielectric 540 forms a tunnel gate insulator and floating gate dielectric 542 forms an inter-gate insulator in flash memory devices, where gate dielectric 540 and/or floating gate dielectric 542 include an insulating layer having an atomic layer deposited zirconium silicon oxide. Use of dielectric layers configured in various embodiments is not limited to silicon based substrates, but may be used with a variety of semiconductor substrates.

Figure 6:
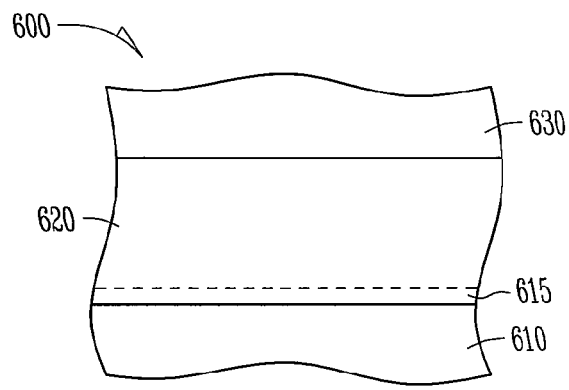
FIG. 6 shows an embodiment of a configuration of a capacitor having a dielectric layer containing an atomic layer deposited zirconium silicon oxide film.

The embodiments of methods for forming dielectric layers containing a zirconium silicon oxide film may also be applied to forming capacitors in various integrated circuits, memory devices, and electronic systems. In an embodiment for a capacitor 600 illustrated in FIG. 6, a method includes forming a first conductive layer 610, forming a dielectric layer 620 containing a zirconium silicon oxide film formed by atomic layer deposition on first conductive layer 610, and forming a second conductive layer 630 on dielectric layer 620. Dielectric layer 620, including an insulating layer having a zirconium silicon oxide film, may be formed using any of the embodiments described herein.

An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated. In an embodiment, interfacial layer 615 is substantially without a silicon oxide layer.

Dielectric layer 620 may be realized as a dielectric layer formed substantially of zirconium silicon oxide. Dielectric layer 620 may include multiple layers in which at least one layer is substantially zirconium silicon oxide. In an embodiment, dielectric layer 620 may include multiple layers where a substantially zirconium silicon oxide film contacts first conductive layer 610. Embodiments for dielectric layer 620 in a capacitor include, but are not limited to, dielectrics in DRAM capacitors and dielectrics in capacitors in analog, radio frequency (RF), and mixed signal integrated circuits.

Various embodiments for a dielectric layer containing a zirconium silicon oxide film formed by atomic layer deposition may provide for enhanced device performance by providing devices with reduced leakage current. In an embodiment, such improvements in leakage current characteristics may be attained by forming one or more layers of an atomic layer deposited zirconium silicon oxide in a nanolaminate structure with other dielectric layers including other metal oxides such as zirconium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a $ZrO_x/ZrSiO_x$ nanolaminate contains alternating layers of a zirconium oxide and a zirconium silicon oxide.

Figure 7:
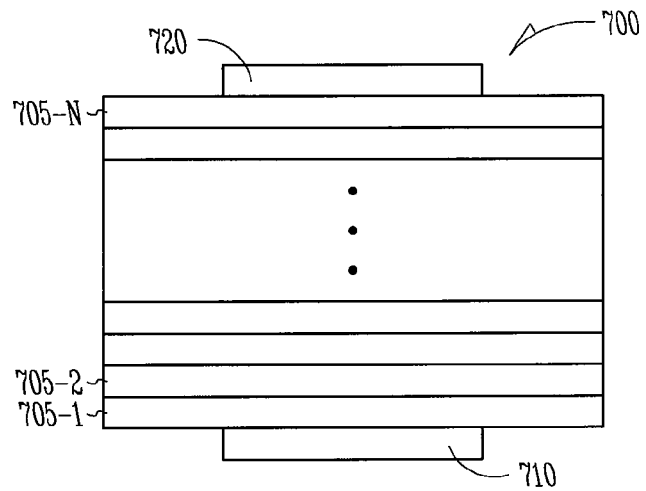
FIG. 7 depicts an embodiment of a dielectric layer including a nanolaminate having at least one layer containing an atomic layer deposited zirconium silicon oxide film.

FIG. 7 depicts a nanolaminate structure 700 for an embodiment of a dielectric structure including an atomic layer deposited zirconium silicon oxide film. In an embodiment, nanolaminate structure 700 includes a plurality of layers 705-1, 705-2 to 705-N, where at least one layer contains a zirconium silicon oxide film formed according to an embodiment herein. The other layers may be other dielectric layers such as, but not limited to, dielectric metal oxides, insulating nitrides, and insulating oxynitrides. The sequencing of the layers depends on the application. In an embodiment, an atomic layer deposited zirconium silicon oxide film is the first layer formed on a substrate. In an embodiment, nanolaminate structure 700 contains an atomic layer deposited zirconium silicon oxide film in contact with conductive contact 710 and/or conductive contact 720. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 700 may be used as nanolaminate dielectrics in NROM flash memory devices as well as other integrated circuits. In an embodiment, a layer of the nanolaminate structure 700 is used to store charge in the NROM device. The charge storage layer of a nanolaminate structure 700 in an NROM device may be a silicon oxide layer.

Transistors, capacitors, and other devices having dielectric films containing an atomic layer deposited zirconium silicon oxide film formed by the methods described above may be implemented into memory devices and electronic systems including information handling devices. Embodiments of these information handling devices may include wireless systems, telecommunication systems, and computers. Further, embodiments of electronic devices having dielectric films containing a zirconium silicon oxide film may be realized as integrated circuits.

Figure 8:
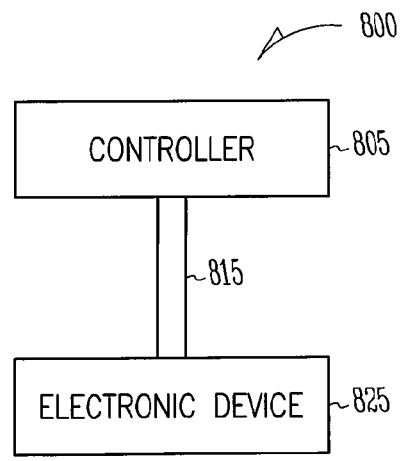
FIG. 8 is a simplified diagram for an embodiment of a controller coupled to an electronic device, where at least one of the controller or the electronic device has a dielectric layer containing an atomic layer deposited zirconium silicon oxide film.

FIG. 8 illustrates a diagram for an electronic system 800 having one or more devices having a dielectric layer containing an atomic layer deposited zirconium silicon oxide film fabricated according to various embodiments. In an embodiment, such a dielectric layer is formed substantially as a zirconium silicon oxide film. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer having a zirconium silicon oxide film formed by atomic layer deposition as previously discussed herein. Electronic system 800 may include, but is not limited to, information handling devices, wireless systems, telecommunication systems, fiber optic systems, electro-optic systems, and computers.

Figure 9:
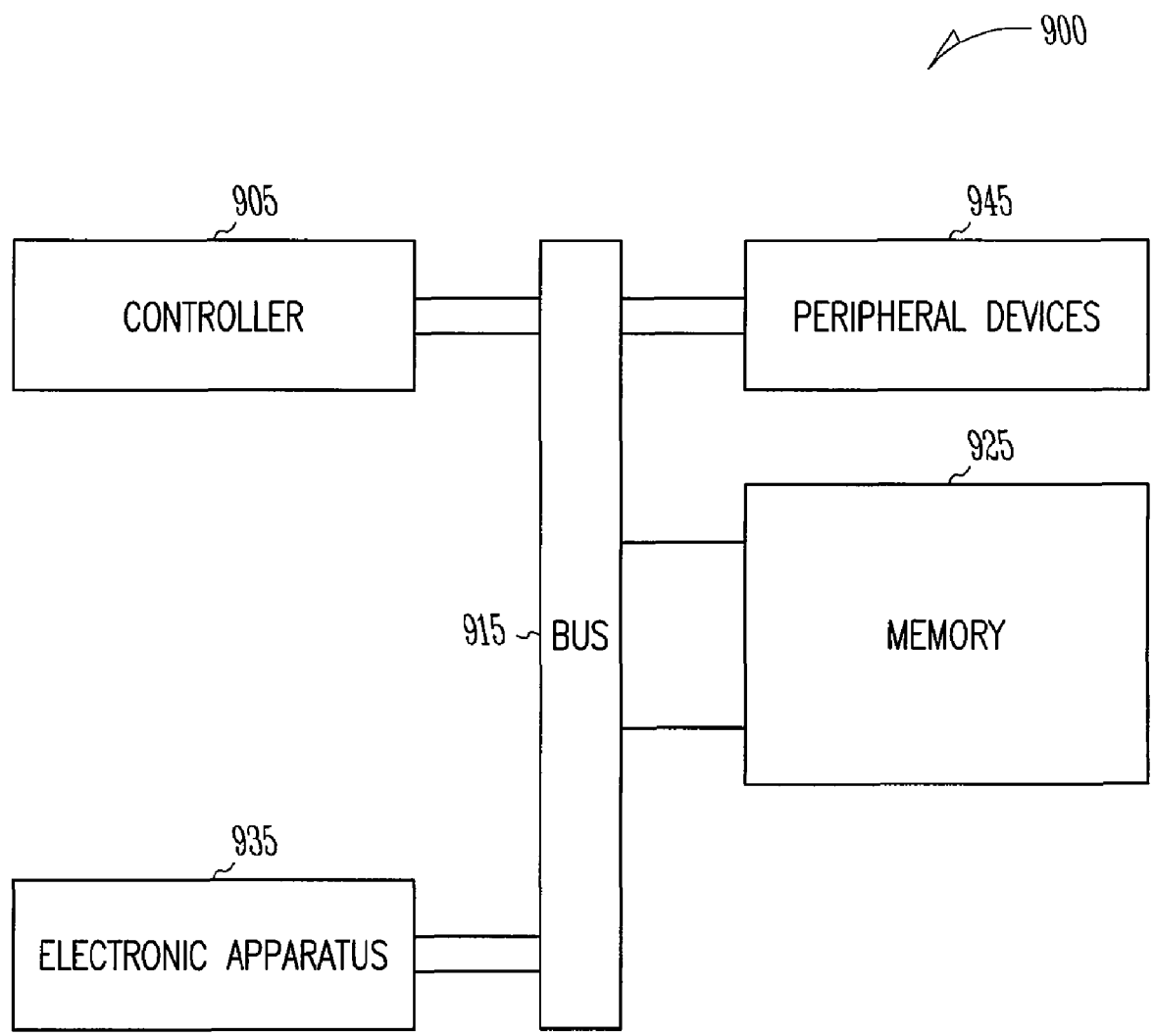
FIG. 9 illustrates a diagram for an embodiment of an electronic system having one or more devices with a dielectric layer containing an atomic layer deposited zirconium silicon oxide film.

FIG. 9 depicts a diagram of an embodiment of a system 900 having a controller 905 and a memory 925. Controller 905 and/or memory 925 may include a dielectric layer having an atomic layer deposited zirconium silicon oxide film fabricated according to various embodiments. In an embodiment, such a dielectric layer is formed substantially as a zirconium silicon oxide film. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternatively, bus 915 may use common conductive lines for providing address, data, and/or control, the use of which is regulated by controller 905. In an embodiment, electronic apparatus 935 may be additional memory configured in a manner similar to memory 925. An embodiment may include an additional peripheral device or devices 945 coupled to bus 915. In an embodiment, controller 905 is a processor. Any of controller 905, memory 925, bus 915, electronic apparatus 935, and peripheral device or devices 945 may include a dielectric layer including a zirconium silicon oxide film formed according to various embodiments. In an embodiment, such a dielectric layer is formed substantially as a zirconium silicon oxide film. System 900 may include, but is not limited to, information handling devices, telecommunication systems, and computers.

Peripheral devices 945 may include displays, additional storage memory, or other control devices that may operate in conjunction with controller 905. Alternatively, peripheral devices 945 may include displays, additional storage memory, or other control devices that may operate in conjunction with controller 905 and/or memory 925.

Memory 925 may be realized as a memory device containing a dielectric layer including a zirconium silicon oxide film formed according to various embodiments. In an embodiment, such a dielectric layer is formed substantially as a zirconium silicon oxide film. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of dielectric layers containing a zirconium silicon oxide film formed by atomic layer deposition, processed in relatively low temperatures, may be amorphous and possess smooth surfaces. Such zirconium silicon oxide films can provide enhanced electrical properties due to their smoother surface, resulting in reduced leakage current. Additionally, such dielectric layers provide a significantly thicker physical thickness than a silicon oxide layer having the same equivalent oxide thickness, where the increased thickness would also reduce leakage current. These properties of embodiments of dielectric layers allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films including an atomic layer deposited zirconium silicon oxide film may be formed having a dielectric constant ($\kappa$) substantially higher than that of silicon oxide. These dielectric films are capable of a $t_{eq}$ thinner than $SiO_2$ gate dielectrics of the same physical thickness. Alternatively, the high dielectric constant relative to silicon dioxide allows the use of much larger physical thickness of these high-$\kappa$ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
a dielectric layer in an integrated circuit on a substrate, the dielectric layer including a nanolaminate having a zirconium silicon oxide film and having an additional zirconium silicon oxide film, the zirconium silicon oxide film structured as one or more monolayers, wherein the zirconium silicon oxide film is zirconium-rich relative to silicon content and the additional zirconium silicon oxide film is silicon-rich relative to zirconium content.

2. The electronic device of claim 1, wherein the zirconium silicon oxide film comprises a zirconium oxide—silicon oxide mixture.

3. The electronic device of claim 1, wherein the zirconium silicon oxide film comprises a zirconium silicate.

4. The electronic device of claim 1, wherein the electronic device comprises a capacitor having the dielectric layer forming at least as portion of a capacitor dielectric.

5. The electronic device of claim 1, wherein the electronic device comprises a transistor in which the dielectric layer is disposed.

6. The electronic device of claim 1, wherein the electronic device comprises a memory having a transistor in which the dielectric layer is disposed.

7. The electronic device of claim 1, wherein the electronic device comprises connections to couple a signal from other components in an electronic system to a conductive layer contacting the dielectric layer.

8. An electronic device comprising:
a first conductive layer in an integrated circuit on a substrate;
dielectric layer structured as a nanolaminate having an amorphous zirconium silicon oxide film and having an additional zirconium silicon oxide film, the nanolaminate disposed on the first conductive layer, the amorphous zirconium silicon oxide film structured as one or more monolayers, wherein the zirconium silicon oxide film is zirconium-rich relative to silicon content and the additional zirconium silicon oxide film is silicon-rich relative to zirconium content; and
a second conductive layer on the amorphous zirconium silicon oxide film.

9. The electronic device of claim 8, wherein the amorphous zirconium silicon oxide film comprises an amorphous zirconium silicate film.

10. The electronic device of claim 8, wherein the electronic device comprises a memory in which the first conductive layer, the amorphous zirconium silicon oxide film, and the second conductive layer are disposed.

11. The electronic device of claim 8, wherein the integrated circuit comprises a radio frequency integrated circuit.

12. An electronic device comprising:
a transistor in an integrated circuit on a substrate, the transistor including:
a source region and a drain region, the source region and the drain region separated by a body region;
a dielectric layer disposed above the body region, the dielectric layer including a nanolaminate having a zirconium silicon oxide film and having an additional zirconium silicon oxide film, the zirconium silicon oxide film structured as one or more monolayers, wherein the zirconium silicon oxide film is zirconium-rich relative to silicon content and the additional zirconium silicon oxide film is silicon-rich relative to zirconium content; and
a gate disposed on the dielectric layer.

13. The electronic device of claim 12, wherein the dielectric layer comprises a dielectric metal oxide.

14. The electronic device of claim 12, wherein the gate comprises a floating gate with the dielectric layer formed as a tunnel gate insulator.

15. The electronic device of claim 12, wherein the gate comprises a control gate.

16. An electronic device comprising:
a memory device on a substrate; and
a dielectric layer in an integrated circuit of the memory device, the dielectric layer including a nanolaminate having a zirconium silicon oxide film and having an additional zirconium silicon oxide film, the zirconium silicon oxide film structured as one or more monolayers, wherein the zirconium silicon oxide film is zirconium-rich relative to silicon content and the additional zirconium silicon oxide film is silicon-rich relative to zirconium content.

17. The electronic device of claim 16, wherein the zirconium silicon oxide comprises an amorphous zirconium silicate.

18. The electronic device of claim 16, wherein the dielectric layer is arranged in a non-volatile read only memory device, the dielectric layer comprising a silicon oxide layer to store charge.

19. The electronic device of claim 16, wherein the nanolaminate includes a layer of $ZrO_x$, $x>0$.

20. The electronic device of claim 16, wherein the dielectric layer is formed as a dielectric layer disposed as a tunnel gate insulator in a transistor in the memory device.

21. The electronic device of claim 16, wherein the dielectric layer is structured essentially as the zirconium silicon oxide film.

22. A system comprising:
a controller;
a bus;
an electronic device coupled to the controller by the bus; and
a dielectric layer in an integrated circuit on a substrate, the dielectric layer disposed in the controller or in the electronic device, the dielectric layer including a nanolaminate having a zirconium silicon oxide film and having an additional zirconium silicon oxide film, the zirconium silicon oxide film structured as one or more monolayers, wherein the zirconium silicon oxide film is zirconium-rich relative to silicon content and the additional zirconium silicon oxide film is silicon-rich relative to zirconium content.

23. The system of claim 22, wherein the dielectric layer comprises one or more dielectric metal oxides in addition to the zirconium silicon oxide film.

24. The system of claim 22, wherein the zirconium silicon oxide film comprises a zirconium oxide—silicon oxide mixture.

25. The system of claim 22, wherein the system comprises a wireless system.

* * * * *